United States Patent
Kurshan et al.

[11] Patent Number: 5,946,481
[45] Date of Patent: *Aug. 31, 1999

[54] METHOD FOR DETECTING ERRORS IN MODELS THROUGH RESTRICTION

[75] Inventors: Robert Paul Kurshan, New York, N.Y.; Carlos Manuel Roman, Bethlehem, Pa.

[73] Assignee: Lucent Technologies Inc., Murray Hill, N.J.

[ * ] Notice: This patent is subject to a terminal disclaimer.

[21] Appl. No.: 08/923,297

[22] Filed: Sep. 4, 1997

Related U.S. Application Data

[63] Continuation-in-part of application No. 08/871,022, Jun. 6, 1997.

[51] Int. Cl.⁶ ........................................ G06F 17/50
[52] U.S. Cl. ........................... 395/500.34; 395/500.43
[58] Field of Search ............................ 364/488, 489, 364/490, 512, 578; 365/186; 395/10, 12, 183, 911, 912, 500

[56] References Cited

U.S. PATENT DOCUMENTS

| | | | |
|---|---|---|---|
| 5,163,016 | 11/1992 | Har'El et al. | 364/578 |
| 5,465,216 | 11/1995 | Rotem et al. | 364/448 |
| 5,485,409 | 1/1996 | Gupta et al. | 395/186 |
| 5,604,841 | 2/1997 | Hamilton et al. | 395/12 |
| 5,691,925 | 11/1997 | Hardin et al. | 364/578 |

OTHER PUBLICATIONS

An Iterative Method to Reduce Statge Space for Efficient Formal Verification, IBM Research Disclosure Journal, p. 291, Mar. 1998.

*Primary Examiner*—Kevin J. Teska
*Assistant Examiner*—Lonnie A. Knox
*Attorney, Agent, or Firm*—James DiGiorgio; Stephen M. Gurey

[57] ABSTRACT

The invention presents a method and apparatus for forming a restricted model from a system model to reduce the computational resources required to formally verify the system design, without substantially reducing the ability to test all system model functions, or properties. In general, the restricted model is formed by restricting the range of assumable values of system model variables and system model inputs to a restricted set of values, based on the values assumed by the system model variables and system model inputs during a partial search of the system model. The restricted model can then be fully searched by a conventional verification tool to identify system design errors. Advantageously, the restricted model requires less computational resources to verify the system design (i.e. through a full search) than the original system model.

45 Claims, 2 Drawing Sheets

METHOD FOR DETECTING ERRORS IN MODELS THROUGH RESTRICTION

CROSS REFERENCE TO RELATED APPLICATION

This is a continuation-in-part of the present inventors' co-pending application entitled "Method For Detecting Errors In Models Through Restriction," Ser. No. 08/871,022, filed Jun. 6, 1997.

FIELD OF THE INVENTION

The present invention relates to system verification, and more particularly to a method and apparatus for checking the behavior of system models.

BACKGROUND OF THE INVENTION

An ongoing problem in the design of large systems is verifying that the system will behave in the manner intended by its designers. One approach has been to simply try out the system, either by building and testing the system itself or by building and testing a model of the system. Since there is no guarantee that an untested system will work as expected, building the system itself can be an expensive proposition. Thus, those skilled in the art have migrated toward building and testing a model of the system through software.

A system model can be said to be a computer program or block of code that, when executed, simulates the intended properties (i.e. functions and/or features) of the system. The computer program, or system model, is designed to accept inputs, perform functions and generate outputs in the same manner as would the actual system. Thus, by controlling the value of the system model inputs and monitoring the system model outputs, the functionality, or properties, of the system can be tested.

One method of testing a system model is called formal verification. In formal verification, the system model (i.e. computer program) is fed into a verification tool which converts the system model into a finite state machine. The finite state machine is a set of states and state transitions which mimic the operation of the system model in response to any given set of system model inputs. More specifically, each state represents a state or mode of operation the system model would enter given a set of inputs, and each state transition indicates the conditions (i.e. the value of system model inputs and system model variables) that must be met for the system model to transition from one state to another state.

Once a system model is converted to a state machine, a verification tool can test whether the system model behaves according to a set of expected behaviors (i.e. system properties). To do this, the verification tool varies the system model inputs and monitors which states the system model enters as a result of the inputs. This has been referred to as searching the state space of the system model. While searching the system model state space, the verification tool can check whether the system model enters a state or a cycle of states (i.e. repeatedly entering the same states over and over again) which the designers of the system define as "bad" or unintended. If the system model enters a "bad" state or a "bad" cycle of states, the system model is said to behave in a manner contradictory to that intended by the system designer, thus requiring a redesign.

Heretofore, in order to fully test every property of the system model through formal verification, the verification tool has had to run what is called a full search of the system model state space (i.e. the set of states and transitions that comprise the system model state machine). A full search of a system model state space is a test wherein, at each state, the system model inputs are varied such that they take on every value they can possibly assume in every possible order or sequence. That is, a full search tests the behavior of the system model in response to every possible set of input values that the system model inputs can possibly assume when the system model is in operation. As a result, a full search insures that the system model behavior is tested under every set of conditions that the system model can possibly undergo when in operation. Thus, a full search of a system model state space insures that every property of the system model is fully tested.

Looking at a simple example, a full search can be performed on a system model of a counter which increments a number, by one, up to ten each time it receives an input having a value of binary zero, and decrements the number, by one, down to zero each time it receives an input having a value of binary one. In such a system model, the numbers 0 through 10 represent the states the system model can enter, and the input values, binary zero and binary one, control the transitions between the states. As a result, the system model does not have or use any variables to define the behavior of the counter. Thus, this simple example is only intended to illustrate how the values (i.e. the sequence of values) input to the counter during a full search affect the behavior of the model of the counter (i.e. system model).

When fully searching the system model, the search engine of the verification tool can start at a state representing the number 1 (i.e. state 1), vary the input over the entire range of assumable values (i.e. binary one and binary zero) in every possible sequence (i.e. Sequence 1: binary zero, then binary one; Sequence 2: binary one, then binary zero), and identify the set of "next states" that the system model actually enters given each input in each sequence. For example, when inputting Sequence 1 (i.e. binary zero, then binary one) at state 1, the set of "next states are state 2 and state 0, respectively. And, when inputting Sequence 2 (i.e. binary one, then binary zero) at state 1, the set of "next states" are state 0 and state 1, respectively. Note, in this example, that the same set of "next states" (i.e. state 1 and state 0) are identified when inputting Sequence 1 as well as Sequence 2 to the system model at state 1.

For each of the identified "next states," the inputs are again varied over the entire range of possible values, in every possible sequence, to determine a new set of "next states." This process is repeated until the search engine traces through the system model state space and determines that the system model can only enter a state (i.e. next state) that was already entered, or checked. Ultimately, if the full search finds that the system model did not enter a "bad" state or set of states in response to a set of inputs, then the system model design is said to be error-free. That is, the system model is said to behave according to its design specification.

From this example, one can imagine that the more complex the system model becomes (i.e. the greater the number of system model inputs, the wider the range of assumable values for each input, and/or the greater the number of states), the greater the amount of computational resources that are necessary to complete a full search of the system model state space. In fact, it has been found that fully searching a sufficiently complex models with conventional verification tools can cause the verification tool to run out of computational resources (e.g. no more RAM available to the search engine). When this happens, the verification tool may "lock-up" (i.e. stop the full search) without providing the tester with data as to whether the system model had behaved as expected for any part of the full search performed before the "lock-up." As a result, when fully searching such complex system models with conventional verification tools, the tester may be left with no way of determining whether the system model has a design error (i.e. can enter a "bad" state or cycle of states).

One solution to this problem is to reduce the size of the system model and run a full search of the reduced model. That is, a tester or programmer experienced in the details of the system model (i.e. how the system inputs and system variables affect the behavior of the system model) may eliminate portions of the system model (i.e. lines of code and/or system model inputs and variables) that appear to have no effect on a limited set of system properties (i.e. those system functions which the programmer decides are not critical to check). This may require, however, substantial time, effort and experience on the part of the programmer to insure that the system model is not reduced such that the reduced model fails to retain those portions that are critical for testing the designated set of system properties. In addition, although reducing the system model reduces the amount of computational resources required to check the system model, such a reduction prevents a full search from checking the behavior of all system model properties.

SUMMARY OF THE INVENTION

We have discovered a method and apparatus for reducing the computer resources needed for checking the behavior of a system model, substantially eliminating any requirement that the user have knowledge of the system model design, and maintaining the ability to test substantially all system model properties. This is accomplished by restricting the assumable values of a set of system model variables and system model inputs, based on the behavior of the system model during a partial search. A partial search is a search which identifies the states which the system model can enter when given a partial set of input values that are input in a limited number of possible sequences. That is, a partial search does not test the behavior of the system model in response to every possible input value (i.e. the entire range of assumable values) in every possible sequence, as described for the full search above. Rather, during a partial search, the system model is tested in response to only a portion of the total number of possible inputs. In general, the values assumed by a system model variable or system model input during a partial search are used to restrict the set of assumable values for that variable or input. The restricted set of assumable values defines the values that the particular system model input or variable can assume during system model verification. Thus, by defining a restricted set of assumable values for a set of system model variables and system model inputs, the system model is thereby transformed into a restricted model.

The restricted model is essentially a version of the system model having certain state transitions that are no longer allowed. That is, by restricting the variables of the system model to a limited set of values (i.e. based on the values assumed during a partial search), the state machine of the system model is thereby restricted as to which state transitions are allowed (i.e. only those transitions defined by variables and/or inputs having values included in the restricted set of values for that variable and/or input). Advantageously, each restriction is based on the actual performance of the system model when in operation (i.e. during a partial search), and thus substantially eliminates any requirement that the user have knowledge of the system model design. Moreover, a full search of the restricted model (e.g. by a conventional verification tool) to identify design errors essentially involves searching a smaller or restricted state space of the original system model, and thus require less computational resources than would a full search of the original system model.

In one illustrative embodiment, the restricted set of assumable variables for each restricted variable and input is based on a random partial search. A random partial search is a partial search wherein the values input to the system model are randomly chosen and input in a random sequence. A random partial search eliminates the guesswork involved in deciding which set of values should be input to identify errors in the system model. Rather, a random partial search empowers the search engine to randomly choose values and input the chosen values in a random sequence at each state. In such an embodiment, the restricted set of assumable values for each system model variable and each system model input may include only those values that the input or variable assumed during the random partial search.

In a preferred embodiment, before the partial search, the system model is first reduced to eliminate the system model variables and system model inputs, as well as the assumable values of the variables and inputs, that have no effect on the behavior of the set of system properties, or functions, being tested. The resultant reduced system model is then restricted, as described above, to form a restricted/reduced model. The resultant restricted/reduced model can then be run through a full search to check the behavior of the set of system properties, and thus identify design errors without exhausting the computational resources of the verification tool.

If an error is identified during the partial search of the system model or a derivative of a system model (e.g. a reduced model), there is full assurance that the error exists in the original system model. If, however, no error is found during the partial search, there is only partial assurance that the system model is error-free. The partial assurance is due to the fact that only a partial search was performed on the original system model, and thus the behavior of the system model was tested in response to a limited set of inputs.

If, however, an error is identified during a full search of a restricted model or a derivative of a restricted model (e.g. a restricted/reduced model) formed according to the present invention, then there is only partial assurance that the error is a true error. This is due to the fact that the step of restricting the model, as described herein, may result in some system model variables being restricted to a constant value (i.e. a now-constant variable), whereas other system model variables may be restricted to a plurality of values (i.e. a non-constant variable). When this happens, there often arises the situation wherein a now-constant variable is dependent on the value of a non-constant variable. This essentially has the effect of breaking the dependency between the now-constant variable and the non-constant variable or any other variable upon which the value of the now-constant variable depended in the system model. This is due to the fact that the now-constant variable no longer will change value depending on the value of the variable upon which it previously depended.

When a restricted model having such broken dependencies is fully searched, there may be a set of inputs which cause the now-constant system model variable to take on a value which it would not have assumed if the same set of inputs were input to the original (i.e. non-restricted) system model. As a result, during such a full search of the restricted model, the restricted model may mistakenly enter a state or set of states that the original system model would not have entered given the same set of inputs (i.e. the same values input in the same sequence). When this happens, a full search of the restricted model may report an error that does not exist in the original model. Such an error is said to be a "false" error because it is not due to an error in the original model, rather it is a result of an imperfect restriction of the original system model.

Thus, according to the present invention, additional steps must be taken to obtain full assurance that an error identified during a full search of a restricted system model is a true error. In one embodiment, the additional steps may include the step of verifying that the identified error exists in the original system model. In another embodiment, the additional steps may include the step of adjusting the restricted model, before the full search, to increase the probability that the restricted model will behave as would the original system model, when given a set of inputs.

Thus, although a full search of a restricted model, according to the present invention, can not fully insure that the original model is error-free in all cases, the restricted model enables the identification of errors in complex models which previously could not be reliably tested through conventional verification tools. As a result, the present invention overcomes, to a significant extent, the limitations associated with the prior art.

These and other features of the invention will become more apparent from the detailed description of illustrative embodiments of the invention when taken with the drawings. The scope of the invention, however, is limited only by the claims.

DETAILED DESCRIPTION OF ILLUSTRATIVE EMBODIMENTS OF THE INVENTION

As described above, a model of a system (i.e. a system model) is basically a computer program that is designed to behave in the same manner as the actual system. That is, a system model is designed to accept inputs, perform functions and generate outputs in the same manner as would the actual system. The behavior of a system model can be imitated or represented by a finite state machine. A finite state machine is essentially a system of states and state transitions which defines the possible modes of operation (i.e. states) that a system can enter, and the conditions upon which the system will transition from one mode to another mode (i.e. the state transitions).

The states and state transitions of a finite state machine form what is called a state space which spatially represents or defines the behavior of a given system or system model. That is, the state space spatially represents the conditions upon which the system model will make a transition from one state to another state. The conditions are generally expressed in terms of inputs and variables of the system model. That is, the condition upon which a finite state machine transitions from one state to another state depends on the values assumed by given system model inputs and system model variables. As a result, the behavior of a system can be checked and/or tested by examining the behavior of a finite state machine which represents the system model in response to the inputs and variables of the system model taking on different values.

Figure 1:
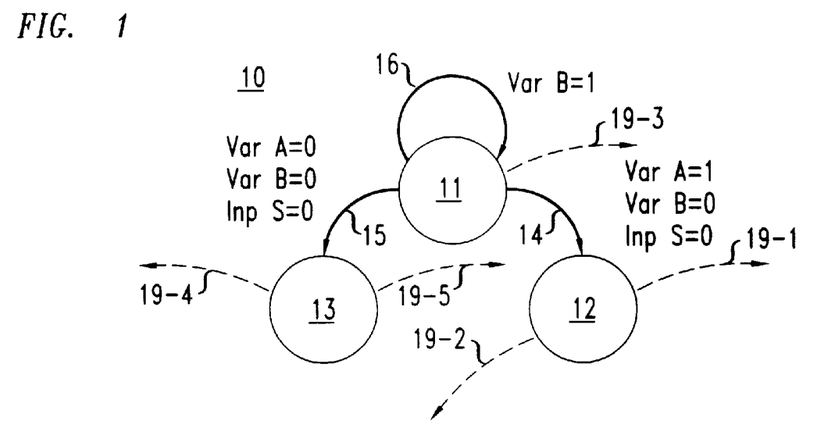
FIG. 1 is a state diagram of a system model.

An illustration of a state machine 10 which represents the behavior of only a portion of a given system model is shown in FIG. 1. As shown, state machine 10 has a set of states 11–13, and a set of state transitions 14–16, and 19-1–19-5. State transition 14 defines the condition (i.e. Variable A=1, Variable B=0 and Input S=0) upon which the system model transitions from state 11 to state 12. State transition 15 defines the condition (i.e. Variable A=0, Variable B=0 and Input S=0) upon which the system model will transition from state 11 to state 13. State transition 16 defines the condition (i.e. Variable B=1) upon which the system model remains at state 11. State transitions 19-1–19-5 are shown only to illustrate that state machine 10 only represents a portion of the system model, and thus does not include all the states and/or state transitions that would be included in a state machine representing the behavior of the entire system model.

In this example, Input S is an input (e.g. a voltage level) to a system model (e.g. an oven that bakes a circuit board), whereas Variables A and B are program variables (e.g. Variable A being a measure of the temperature inside the oven, and Variable B being the measure of the temperature outside the oven) which are used by the system model to imitate or define the behavior of the actual system (e.g. the oven). A value input to Input S is said to be a value assumed by Input S. It is the past and/or present values assumed by Input S, as well as the past and/or present values assumed by Variables A and B that may, but not necessarily, control the values that are presently assumed by Variables A and B. Thus, it can be understood that the behavior of state machine 10 (and thus the portion of the system model represented by state machine 10) depends on the sequence of values input to Input S.

Consequently, the behavior of that portion of the system model represented by state machine 10 may be tested by starting at a given state, inputting a set of values in a given sequence to Input S, identifying the values assumed by Variables A and B in response to the set of input values, and tracing the state transitions that result from the assumed values. As described above, such a test is called a search of the system-model state space (i.e. state machine 10).

To fully test every function, or property, of the system model, the system model state space must be fully searched. As described above, a full search of the system model state space involves inputting every set of possible input values, in every possible sequence, at each state. The set of all possible input values for each input of the system model makes up what is called the set of assumable values for that input. Thus, a full search involves: (1) inputting to each system model input, at each state, the full set of assumable values in every possible sequence, (2) tracing the state transitions that occur as a result of each system model variable being forced to assume every value (in its set of assumable values), in every possible sequence, and (3) determining whether the system model (i.e. state machine) enters a "bad" or unintended state or cycle of states as a result of the inputs. In a complex system model (i.e. a model having a large number of inputs and/or a large set of assumable variables for each input and/or variable), however, such a full search can require more computational resources than are available to the verification tool performing the full search. Thus, it may be impossible to perform a full search of some complex system models with a conventional verification tool.

One method for reducing the amount of computational resources needed to test the behavior of a system model is to program the verification tool to perform a partial search. A partial search is similar to a full search except that the behavior of the system model is tested in response to only a portion of the values that the system model inputs can possibly assume (i.e. only a portion of the set of assumable values), and in only a limited number of the possible sequences. For example, a partial search of state machine 10 would involve inputting only a portion of the values which input S could possibly assume (i.e. only a portion of the set of assumable values for Input S), in only a single sequence, at each state. Note that this is different from a full search wherein all the values that each input can possible assume (i.e. all values in the set of assumable values for each input) are input to each system model input in every possible sequence, at each state.

Figure 2:
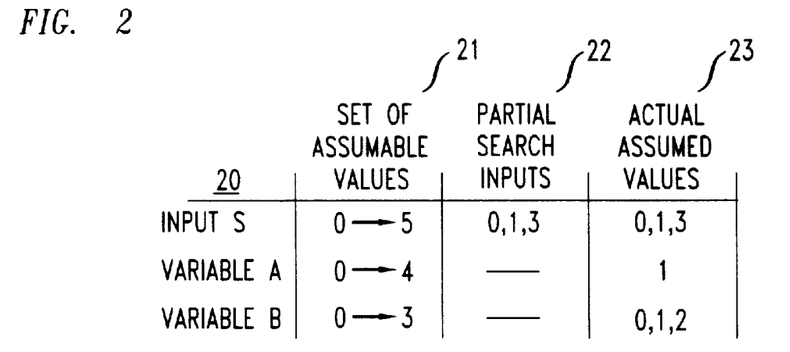
FIG. 2 is a table that illustrates the behavior of a system model, represented by the state diagram shown in FIG. 1, during a partial search.

The mechanics of a partial search may be further understood by observing the behavior of a finite state machine in response to a given set of partial search inputs. Referring now to FIG. 2, there is shown a table 20 which illustrates the behavior of state machine 10 in response to a partial search. As shown, table 20 has three columns 21, 22, and 23. Column 21 shows the set of assumable values for Input S, Variable A and Variable B. That is, Column 21 shows all the values that Input S, Variable A and Variable B can possibly assume when state machine 10 (i.e. the portion of the state machine that represent the system model) is in operation. Column 22 shows the set of partial search values that were actually input to Input S during the partial search. That is, Column 22 shows the actual sequence of values input to Input S at each state of state machine 10. Note that since only the sequence 0, 1 and 3 were input to Input S at each state, the search engine did not test the behavior of state machine 10 in response to every value included in the set of assumable values for Input S, nor did the search engine test the behavior of state machine 10 in response to every possible sequence of values at each state.

Column 23 shows which values (i.e. the partial search values) that were actually assumed by Input S at one time or another during the partial search. In addition, Column 23 shows the values that Variables A and B assumed in response to Input S taking on the partial search values, in the given sequence (shown in Column 22), at each state. As shown, Variable A only assumed the integer value 1, whereas Variable B only assumed the integer values 0, 1 and 2. Note that neither Variable A nor Variable B assumed every value in its respective set of assumable values (i.e. the integer values 0–4 for Variable A and 0–3 for Variable B, as shown in Column 21). This means that during the partial search, Variable A never assumed the integer value 0 which is required for state machine 10 to transition from state 11 to state 12, as shown in FIG. 1. As a result, the partial search never tested state transition 15.

Thus, it can be understood that a partial search does not necessarily test every function or behavior of a system model. In addition, it can be understood that a partial search may not necessarily expose a system model error that would have been exposed if the entire range of assumable variables were input to each system model input in every possible sequence at each state, as in a full search. Therefore, although performing a partial search may reduce the amount of computational resources needed to test the system model, the tester is left with no assurance that the set of partial search values input to the system model inputs will expose an error in the system model design. In addition, in performing a partial search the tester is left with the difficult task of guessing which values should be input, and in what sequence, to assure that system model errors will be exposed or identified.

We have discovered that the behavior of a system model, during a partial search, can be utilized to reduce the computational resources required to fully search the system model, without substantially decreasing the ability to identify system model errors. In general, this is done by forming a restricted model in which a) system model inputs are restricted to a set of values that were used as inputs during a partial search, and b) system model variables are restricted to a set of values were assumed by the system model variables during the partial search. This is significant in that the restriction is not random, but rather it is based on the behavior of the system model in response to an actual set of inputs. This is advantageous in that when making a restricted model the programmer or tester does not have to spend hours deciding which values are important to include in the restricted set of values for each system model variable and/or input. Rather, the restriction can be based on the actual performance of the variable or input during an actual test of the system model behavior (i.e. a partial search of a state machine that represents the system model).

To illustrate, a restricted model can be formed according to the present invention from the system model represented as state machine 10 by restricting Input S, Variable A and Variable B to a restricted set of values based on, for example, the values assumed by each during the partial search illustrated in table 20. In one illustrative embodiment, a restricted model is formed by restricting Input S to the set of values 0, 1, and 3, Variable A to a constant value 1, and Variable B to the set of values 0, 1 and 2. In another illustrative embodiment, Input S and Variable A are restricted as just described, but Variable B is restricted to the set of values 0 and 1. In yet another illustrative embodiment, a restricted model may be formed by restricting Variable A to the value 1, and leaving Input S and Variable B unrestricted. Thus, it should be understood that those skilled in the art can restrict the system model inputs and system model variables in any manner desired as long as the restricted set of values for an input or variable is based on the values assumed by that input or variable during a partial search.

Once formed, the restricted model can then be fully searched by a conventional verification tool to identify system errors, but with substantially less risk of exhausting the computational resources available to the verification tool than when fully searching the system model. This is due to the fact that restricting a system model input or system model variable to a set of values that is smaller than the entire set of assumable values for that input or variable has the effect of eliminating state transitions from the state machine representing the system model. For example, referring to state machine 10 shown in FIG. 1, if Variable A is restricted to the integer value 1, then state machine 10 may no longer transition from state 11 to state 13. This essentially has the effect of eliminating state transition 15 from any search of the state space defined by state machine 10. As a result, by restricting Variable A to the integer value 1 to form a restricted model according to the present invention, the size of the search area of state machine 10 is reduced. Thus, the amount of computation resources and time required to perform a full search of the restricted model is substantially less than that required to perform a full search of the original system model.

Since the restrictions according to the present invention are based on the actual values that the system model variables assume during operation of the system (i.e. during a partial search), the restrictions inherently eliminate only those values which the system model variables are less likely to take on when in operation. Thus, a restriction of a system model according to the present invention substantially eliminates only those portions of the system-model search area that involve the least traversed state transitions (i.e. the state transitions that are least likely to occur when the actual system is in operation). As a result, a restriction according to the present invention substantially reduces the amount of computational resources required to identify errors, while maintaining the ability to identify errors in the system design.

Figure 3:
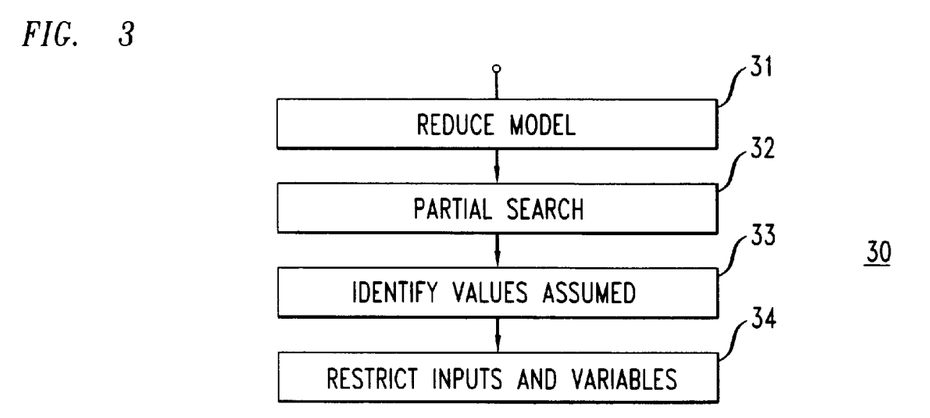
FIG. 3 is a block diagram of an illustrative embodiment of a method according to the present invention.

Referring now to FIG. 3, there is shown a block diagram of an illustrative embodiment of a method 30 for forming a restricted model from a system model, according to the present invention. As shown, method 30 begins with the step 31 wherein system model variables and system model inputs, which have no effect on specific system model functions or properties that are to be tested, are removed from the system model to form a reduced system model. The reduced system model is then run through a partial search, at step 32. The values assumed by the inputs and variables of the reduced system model during the partial search are identified at step 33. Then, at step 34, each variable and input of the reduced system model is independently restricted to a restricted set of values, based on the values assumed by that variable or input during the partial search, to form a restricted/reduced model.

The resultant restricted/reduced model can be fully searched by conventional verification tools to identify errors. Such a full search would involve testing the behavior of the restricted/reduced model in response to the inputs of the restricted/reduced model being given each value in their restricted set of values in every possible sequence at each state. Advantageously, such a full search of the restricted/reduced model requires less computational resources than a full search of the original system model because, as described above, restricting the variables and inputs has the effect of reducing the search area, and the number of inputs tested at each state of the system model state machine. As a result, the present invention can enable a conventional verification tool to check the behavior of very complex system models, without having to check every state transition, and thus without running out of computational resources.

It should be noted that the step of restricting the system model variables, as described above, may result in some system model variables being restricted to a constant value (i.e. a now-constant variable), whereas other system model variables may be restricted only to a limited set of values (i.e. a non-constant variable). When this happens, there often arises the situation wherein the value of a now-constant variable depends on the value of a non-constant variable. This essentially has the effect of breaking the dependency between the now-constant variable and the non-constant and/or any other variable upon which the value of the now-constant variable depends. The broken dependency is due to the fact that the variable restricted to a constant value will no longer change its value in response to a change in the value of the variable upon which it depends.

When a restricted model having such broken dependencies is fully searched, there may be a set of inputs (e.g. in a given sequence) which cause a variable restricted to a constant value to take-on a value which it would not have assumed if the same set of values were input in the same sequence to the original (i.e. non-restricted) system model. As a result, the restricted system model may mistakenly enter a state or set of states that the original system model would not have entered given the same set of inputs. Moreover, due to the restricted model entering the mistaken state or set of states, a full search of the restricted model may report an error that does not exist in the original model. Such an error is said to be a "false" error because it is not due to an error in the original model, rather it is a result of an imperfect restriction of the original model.

Thus, in order to obtain full assurance that an error identified during a full search of a restricted system model, according to the present invention, is a true error, additional steps must be taken. In one embodiment, the additional steps may include the step of verifying that the identified error exists in the original system model (i.e. a false error check). The false error check may be accomplished by simply inputting to the original system model the same set of values in the same sequence that caused the error in the restricted model. If the original model reports the same error as identified during the full search of the restricted model, then the identified error is a true error. If, however, the original system model does not report the same error, then the error is a false error. In either case, the identified error is verified.

When a false error is identified, the restricted model may be refined to more accurately reflect the behavior of the original system model, and then fully searched again. For example, if an error identified during a full search of the restricted system model is found to be a false error (i.e. during a verification of the error in the original system model), the variables and inputs of the restricted model can be resized, based on the values assumed by those variables and inputs during the verification in the original model. That is, the restricted set of values for a given variable of the restricted model can be resized or changed to include any value that the variable assumed during the verification in the original model (i.e. the false error check). This, in effect, increases the number of values that the variable can assume during a full search of the restricted model, and thus enables the restricted model to behave more like the original system model during such a full search. As a result, resizing the restricted variables reduces the potential of identifying a false error during any subsequent full search of the restricted model.

In another embodiment, the additional steps may include steps for refining the restricted model before the full search. One method of accomplishing this is to identify, before performing a full search of the restricted model, all system model variables that are restricted and that have a dependency on other system model variables that are not restricted. Then, during the full search of the restricted model, testing whether these "identified" variables behave as defined in the original (i.e. un-restricted) system model. This can be accomplished by monitoring the values assumed by the "identified" variables during the full search of the restricted model, and testing whether the "identified" variable should have assumed a value other than the values to which it is restricted.

If it is determined that an "identified" variable should have assumed a value not included in its restricted set, then it is assumed that the "identified" variable may cause the full search of the restricted model to identify a false error, as described above. To substantially reduce the probability that such a false error is identified, the state transitions which depend on the value of the "identified" variable are removed from the state space of the restricted model. That is, the state transitions are disabled during a full search of the restricted model. This substantially insures that a full search of the restricted model will not traverse any part of the state space that is adversely affected by a broken dependency, and thus insures that no false errors, due to the broken dependencies, result from the full search.

The present invention is not limited to any specific method of checking whether an error identified during a full search of the restricted model is a false error. Those skilled in the art can employ any means desired to accomplish this task. For example, in one illustrative embodiment, the step for checking whether an error identified during a full search of the restricted model is a false error includes the steps of making a list of all system model variables that are dependent on a restricted system model variable, forming a reduced version of the system model that includes the variables in the list as well as all the variables that lie in a dependency path therefrom, and testing whether any of these variables are adversely affected by broken dependencies, as described above. If the variables are adversely affected by the broken dependencies, then any state transitions that depends on the value of that variable can be disabled or removed from the restricted model. As described above, this reduces the potential that a full search of the restricted model (i.e. non-reduced) will identify a false error.

In another illustrative embodiment, errors identified in the restricted model are verified by performing a full search of a reduced version of the original system model (i.e. a system model including only those states and state transitions related to the behavior of the system being tested). If the full search of the reduced model reports the same error as found during the full search of the restricted model, then the error is a true error. If, however, the full search of the reduced model does not report the same error, then the error is a false error. When such a false error is identified, the restricted model may be changed by resizing the variables of the restricted model based on the values assumed by the variables during the full search of the reduced model. As described above, this changes the restricted model into a "new" restricted model which will behave more like the original (non-restricted) system model. Thus, the "new" system model can be fully searched with less likelihood that false errors will be identified. By repeating this process for each identified error, the restricted model will become less and less likely to identify false errors, thus improving the process of fully searching a system model that was restricted according to the present invention.

Figure 4:
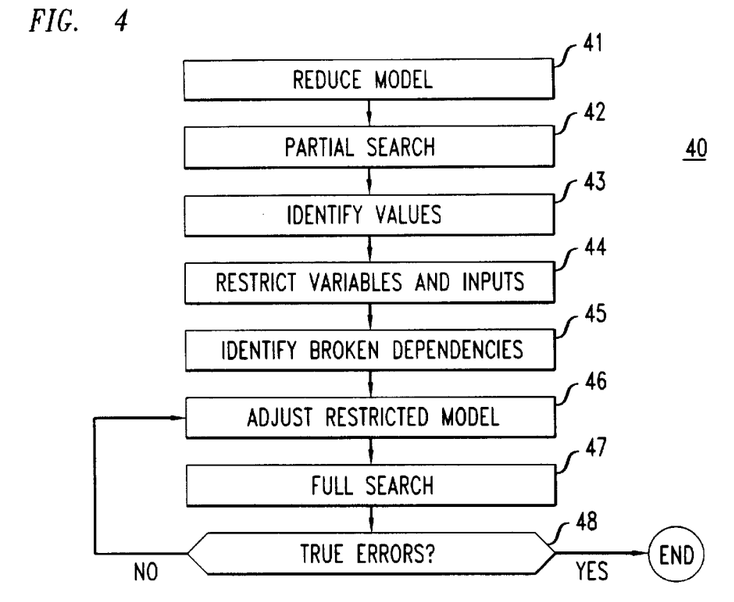
FIG. 4 is a block diagram of another illustrative embodiment of a method according to the present invention.

Referring now to FIG. 4, there is shown another illustrative embodiment of a method according to the present invention, hereinafter referred to as method 40. As shown, method 40 begins with the step 41 of reducing the system model to eliminate system model variables and system model inputs that have no effect or dependence on inputs or variables that affect specific system model functions or properties. The reduced system model is then run through a partial search, at step 42. During the partial search, the values assumed by the inputs and variables of the reduced system model are identified, at step 43. Then, at step 44, each variable and input of the reduced system model is independently restricted to a restricted set of values, based on the values assumed by that variable or input during the partial search, to form a restricted/reduced model. The restricted/reduced model is then analyzed at step 45 to identify variables having broken dependencies, that resulted from the restriction performed at step 44, and to identify any variables that depend on the variables having the broken dependencies. The restricted model is then adjusted at step 46 to reduce the probability that an identified variable will cause the restricted model to behave in a manner inconsistent with the system model. Then, at step 47 the restricted model is fully searched to identify errors therein. The errors are then checked at step 48. If, at step 48, the identified error is determined to be a true error (i.e. the same error exists in the system model), then the process reports the error and ends. If, however, the identified error is determined to be a false error (i.e. the same error does not exist in the system model), then method 40 proceeds to steps 46 wherein the restricted model is readjusted, and thereafter fully searched, as described above.

It should be noted that a partial search used to make the restrictions, according to the present invention, can be a random partial search. A random partial search is a partial search of the system model state space wherein the values of the system model inputs are randomly chosen, rather than pre-set or predetermined. In such an embodiment, the verification tool can be empowered to randomly choose the values of the system model inputs during the partial search. This eliminates the need for a programmer, experienced in the details of the model, to make decisions as to which values should be tested for each system model input.

The steps of the inventive method, as described above and shown in FIGS. 3 and 4, can be performed by any desired means. That is, an apparatus implementing the inventive method, herein, can have any desired structure that provides the desired functionality. Thus, it should be understood that each box shown in FIGS. 3 and 4 may represent a block of code for performing the desired functions described for each box.

Figure 5:
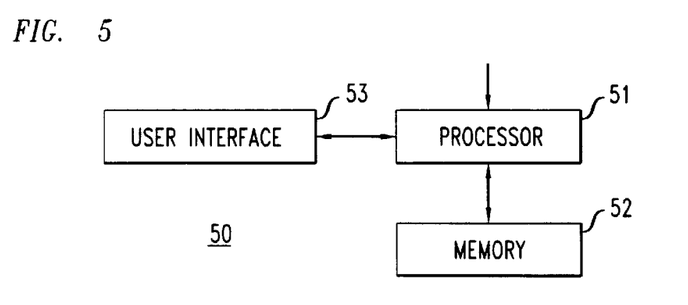
FIG. 5 is a block diagram of an illustrative embodiment of an apparatus according to the present invention.

An illustrative embodiment of an apparatus for forming a restricted model according to the present invention is shown in FIG. 5, and hereinafter referred to as apparatus 50. As shown, apparatus 50 has a processor 51 electrically coupled to a memory 52 and a user interface 53. In operation, processor 51 is operable to reduce the state space of the system model to eliminate the set of system model variables and system model inputs that have no effect on the behavior of a given set of properties of the system model. The reduction thereby transforms the system model into a reduced model. Processor 51 is also operable to run a partial search of the reduced model, identify the values assumed by each variable and each input of the reduced model during the partial search, and store the identified values in memory 52. Processor 51 is further operable to restrict the set of assumable values for each variable and each input of the reduced model, based on the values stored in memory 52, to form a restricted/reduced model. The restricted/reduced model can then be fully checked by a conventional verification tool (not shown). Processor 51 is operable to report any detected errors to a user through user interface 53.

Figure 6:
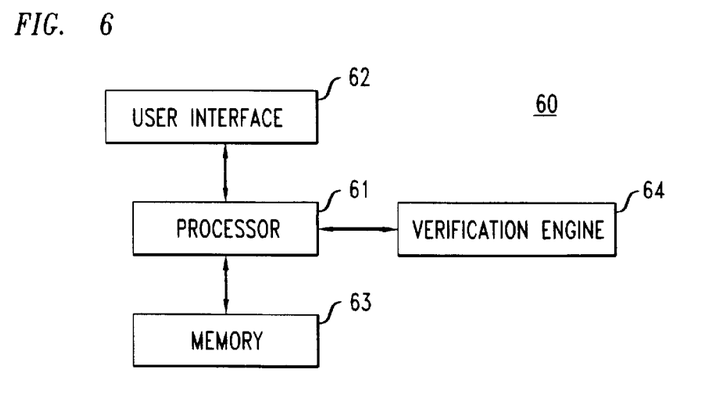
FIG. 6 is a block diagram of an illustrative embodiment of a system for detecting errors in models that were restricted according to the present invention.

Referring now to FIG. 6, there is shown a block diagram of an illustrative embodiment of a system 60 for restricting a system model, according to the present invention, and for identifying errors in the restricted model. As shown, system 60 has a processor 61 electrically coupled to a memory 63, a user interface 62 and a verification engine 64. In operation, processor 61 is operable to direct verification engine 64 to run a partial search of a system model. During the partial search, processor 61 identifies the values assumed by each system variable and each system input, and stores the values in memory 63. Processor 61 is further operable to restrict the system variables and system inputs to a set of values, based on the values stored in memory 63, to form a restricted model. Processor 61 is yet further operable to input the restricted model into verification engine 64 which, in turn, runs a full search of the restricted model. The results of the full search are then reported by Processor 61 to a user through interface 62.

As described above, if an error is identified during a full search of the restricted model there is only partial assurance that the identified error is a true error. The partial assurance is due to the fact that a restriction according to the present invention can result in a broken dependency in the restricted model that may cause a full search of the restricted model to identify a false error. Thus, a system according to the present invention can be operable to perform a means for verifying whether an identified error in the restricted model is a "true error" in the original system model, and/or a means for adjusting the restricted model to reduce the probability that a full search of the restricted model will identify a false error. Examples of such means are described above.

Although a full search of a model restricted according to the present invention can not fully insure that the original model is error-free, the present invention provides a means for reliably finding errors in complex models which previously could not be reliably tested through conventional verification tools, without tedious manual restrictions of the design model. In addition, since the restrictions according to the present invention are based on a partial search, the restrictions are based on the actual performance of the system model (i.e. during a partial search), and thus are based on the values that the system model variables will most likely assume when in operation. It can therefore be understood that each restriction inherently limits the system model variables to those values that the variables are most likely to take-on during actual operation of the system. As a result, a restriction according to the present invention substantially reduces the amount of computational resources required to identify system model errors, while maintaining the ability to identify those errors through a full search of the restricted model.

While the invention has been particularly shown and described with reference to various embodiments, it will be recognized by those skilled in the art that modifications and changes may be made to the present invention without departing from the spirit and scope thereof. Accordingly, various modifications may be made without departing from the spirit or scope of the general inventive concept as defined by the appended claims and their equivalents.

We claim:

1. A method wherein a restricted model is formed from a system model, the system model defining a state space including a plurality of states and state transitions, the state transitions being dependent on values assumed by system model variables and system model inputs, each system model variable and each system model input having a set of assumable values, the method comprising the step of restricting the set of assumable values of a set of system model variables and a set of system model inputs, based on the values assumed by the system model variables and the system model inputs during a partial search of the system model, to thereby form the restricted model.

2. The method of claim 1 wherein said step of restricting comprises the step of defining, for each variable of said set of system model variables and each input of said set of system model inputs, a restricted set of values which said each variable and said each input can assume during a verification of said restricted model.

3. The method of claim 2 further comprising the step of adjusting said restricted set of values to reduce the difference in behavior between the restricted model and the system model.

4. The method of claim 3 wherein said step of adjusting comprises the steps of:

identifying variables of the restricted model which are restricted to a constant value and that have a broken dependency with at least one other variable of the restricted model; and determining whether said identified variables behave as defined by the system model.

5. The method of claim 4 wherein said step of determining comprises the steps of testing whether a given set of inputs to the system model force an identified variable to assume a value not in the restricted set of values defined for said identified variable.

6. The method of claim 5 further comprising the step of removing from the restricted model a set of state transitions which depend on the value of said identified variable if said given set of inputs force said identified variable to assume a value not in the restricted set of values defined therefor.

7. The method of claim 1 further comprising the step of performing a full search of said restricted model to identify errors in the system model.

8. The method of claim 7 further comprising the step of verifying whether said identified errors in the restricted model are true errors.

9. The method of claim 8 wherein said step of verifying comprises the step of inputting into said system model the set of input values that caused the identified error in the restricted model, and determining whether said system model exhibits an error identical to said error identified in said restricted model.

10. The method of claim 9 further comprising the step of refining said restricted model when said system model does not exhibit an error identical to said error identified in said restricted model.

11. The method of claim 10 wherein said step of refining comprises the step of resizing the restricted set of values for a set of variables and inputs of the restricted model, based on the values assumed by said variables and inputs during step of verifying.

12. The method of claim 8 wherein said step of verifying comprises the step of performing a full search of a reduced version of the system model.

13. The method of claim 12 further comprising the step of resizing variables of the restricted model, based on variables assumed by the variables during the full search of the reduced version of the system model, to thereby form a new restricted model.

14. The method of claim 1 wherein said partial search is a random partial search, and wherein said step of restricting is performed automatically.

15. The method of claim 14 further comprising the step of eliminating, from the system model, a set of system model variables and system model inputs that have no effect on the behavior of the system model when checking a set of system model properties so that said step of restricting forms a restricted/reduced model.

16. A method for identifying errors in a system model, the system model being designed to behave in accordance with a set of properties, wherein the system model behavior is dependent on the values assumed by system model variables and system model inputs, each system model variable and each system model input being able to assume a value within a given range of values, the method comprising the steps of:

eliminating, from the system model, a set of system model variables and system model inputs that have no effect on the behavior of a given set of properties of the system model so that the system model is formed into a reduced model;

restricting the range of assumable values of a set of variables and inputs of the reduced model to a restricted set of values, based on the values assumed by the variables and inputs during a partial search of the reduced model, to form a restricted/reduced model; and     performing a full search of the restricted/reduced model to check the behavior of the restricted/reduced model.

17. The method of claim 16 wherein said step of performing a full search comprises the step of identifying errors in the system model.

18. The method of claim 17 further comprising the steps of:

before said step of running a full search, analyzing said restricted model to identify variables, restricted to a constant value during said step of restricting, that have a broken dependency with at least one other restricted-model variable; and     eliminating from said restricted model each said identified variable that has a dependency on another restricted model variable that is not restricted to a constant value.

19. The method of claim 18 further comprising the step of removing from said restricted model a set of restricted model variables having a dependency on said variables eliminated from said restricted model as a result of said step of eliminating.

20. The method of claim 19 further comprising the step of verifying whether said identified errors, during said full search, are true errors.

21. The method of claim 20 wherein said step of verifying comprises the step of inputting, into said system model, the set of input values that caused the identified error in the restricted model, and determining whether said system model exhibits an error identical to said error identified in said restricted model.

22. The method of claim 16 further comprising the steps of:

identifying restricted model variables that are dependent on a variable having a restricted set of values; and     given a set of inputs to the restricted model, determining whether an identified variable assumes a value that said identified variable would not have assumed when given said set of inputs to the system model.

23. The method of claim 16 further comprising the step of resizing a set of restricted model variables, based on a full search of a reduced system model.

24. The method of claim 23 wherein said reduced system model is formed by eliminating portions of the system model that have no effect on the system model functions related to an identified errors, and wherein said set of restricted model variables are resized when said full search of said reduced system model fails to report the same error identified during said full search of said restricted model.

25. The method of claim 16 wherein said partial search is a random partial search, and wherein said step of restricting is performed automatically.

26. An apparatus for forming a restricted model from a system model, the system model defining a state space including a finite number of states and state transitions, the state transitions being dependent on values assumed by system model variables and system model inputs, wherein each system model variable and each system model input has a range of assumable values, the apparatus comprising:

means for obtaining values assumed by the system model variables and the system model inputs during a partial search of the system model; and     means for restricting the range of assumable values of a set of system model variables and a set of system model inputs, based on said values assumed during said partial search, to form a restricted model.

27. The apparatus of claim 26 wherein said means for restricting defines, for each variable of said set of system model variables, and each input of said set of system model inputs, a restricted set of variables which it can assume during a verification of said restricted model.

28. The apparatus of claim 27 further comprising means for running a full search of said restricted model to identify errors in the system model.

29. The apparatus of claim 28 further comprising:

means for analyzing said restricted model to identify variables, restricted to a constant value during said step of restricting, that have a broken dependency with at least one other restricted-model variable; and     means for eliminating, from said restricted model, each said identified variable that should assume a value other than its said constant value, as a result of its dependency on one of said other restricted model variables, when said other restricted-model variables assume a value in said restricted set of values defined therefor.

30. The apparatus of claim 29 further comprising means for removing, from said restricted model, a set of restricted model variables having a dependency on said variables eliminated from said restricted model.

31. The apparatus of claim 27 further comprising means for verifying whether said identified errors, during said full search, are true errors.

32. The apparatus of claim 31 wherein said means for verifying comprises means for inputting, into said system model, the set of input values that caused the identified error in the restricted model, and determining whether said system model exhibits an error identical to said error identified in said restricted model.

33. The apparatus of claim 27 further comprising:

means for identifying restricted model variables that are dependent on a variable having a restricted set of values; and     means for determining whether any identified variables assumed a value that would have been impossible for that variable to assume in the system model.

34. The apparatus of claim 27 further comprising means for resizing a set of restricted model variables, based on a full search of a reduced system model.

35. The apparatus of claim 34 wherein said reduced system model is formed by eliminating portions of the system model that have no effect on the system model functions in which an errors is identified, and wherein said set of restricted model variables are resized when said full search of said reduced system model fails to report the same error identified during said full search of said restricted model.

36. The apparatus of claim 27 wherein said partial search is a random partial search, and wherein said means for restricting is performed automatically.

37. The apparatus of claim 27 further comprising the step of eliminating, from the system model, a set of system model variables and system model inputs that have no effect on the behavior of the system model when checking a set of system model properties so that said step of restricting forms a restricted/reduced model.

38. An apparatus for verifying the behavior of a system model, the system model having a set of states and a set of state transitions, each state transition being dependent on the value of system model variables and system model inputs, each system model variable and each system model input having a range of assumable values, the apparatus comprising:

means for restricting the range of assumable values of a set of system model variables and a set of system model inputs, said restriction being based on the values assumed by system model variables and system model inputs during said partial search of the system model; and means for performing a full search of the restricted model to check the behavior of a given set of properties.

39. The apparatus of claim 38 further comprising means for running a full search of the restricted model to identify errors in the system model.

40. A system for identifying errors in a system model, the system model having properties which function according to the values assumed by system model variables and system model inputs, each system model variable and each system model input being able to assume a value within a given range of values, the system comprising:

means for eliminating, from the system model, a set of system model variables and a set of system model inputs that have no effect on the behavior of a given set of properties of the system model to form a reduced model;

means for running a partial search of the reduced model, and identifying a range of values assumed during said partial search for a set of system model variable and a set of system model inputs of the reduced model;

means for limiting the range of assumable values for a set of system model variables and a set of system model inputs of the reduced model to said range identified during said partial search, to form a restricted/reduced model; and means for performing a full search of the restricted/reduced model to check the behavior of said given set of properties.

41. The system of claim 40 further comprising means for verifying whether said errors identified in the restricted model are true errors in the system model.

42. A method comprising the step of verifying the behavior of a system model having a set of inputs and variables which are restricted to a set of values, said restricted set of values for a given input being based on the values assumed by said input during a partial search, and said restricted set of values for a given variable being based on the values assumed by said variable during said partial search.

43. An apparatus comprising a verification tool for testing the behavior of a system model, said system model having a set of inputs and variables which are restricted to a set of values, said restricted set of values for a given input being based on the values assumed by said input during a partial search of the system model, and said restricted set of values for a given variable being based on the values assumed by said variable during said partial search.

44. A method for formally verifying a system model, said method comprising the step of fully searching a restricted version of the system model, said restricted version of the system model comprising a set of system model inputs and a set of system model variables that are restricted to a set of values, said restricted set of values for a given input of said set of system model inputs being based on the values assumed by said given input during a partial search of the system model, and said restricted set of values for a given variable of said set of system model variables being based on the values assumed by said given variable during said partial search.

45. An apparatus for formally verifying a system model, said apparatus comprising a verification tool for fully searching a restricted version of the system model, said restricted version of the system model comprising a set of system model inputs and a set of system model variables that are restricted to a set of values, said restricted set of values for a given input of said set of system model inputs being based on the values assumed by said given input during a partial search of the system model, and said restricted set of values for a given variable of said set of system model variables being based on the values assumed by said given variable during said partial search.

* * * * *